United States Patent [19]
Solender

[11] 3,855,589
[45] Dec. 17, 1974

[54] ANALOG TO DIGITAL CONVERTER WITH VARIABLE QUANTIZATION AND DYNAMIC RANGE

[75] Inventor: Peter E. Solender, Williamsville, N.Y.

[73] Assignee: Sylvania Electric Products Inc., Danvers, Mass.

[22] Filed: Nov. 25, 1969

[21] Appl. No.: 879,709

[52] U.S. Cl. .......................... 340/347 AD, 324/99 D
[51] Int. Cl. .......................................... H03k 13/04
[58] Field of Search ........................... 340/347, 169; 324/98–100

[56] References Cited

UNITED STATES PATENTS

| | | | |
|---|---|---|---|
| 3,239,833 | 3/1966 | Gray | 340/347 |
| 3,500,247 | 3/1970 | Sekimoto et al. | 340/347 X |
| 3,509,558 | 4/1970 | Cancro | 340/347 |
| 3,509,560 | 4/1970 | Bowers, Jr. et al. | 340/347 |
| 3,513,467 | 5/1970 | Sliwkowski | 340/347 AD |

*Primary Examiner*—Charles D. Miller
*Attorney, Agent, or Firm*—Edward J. Coleman

[57] ABSTRACT

An analog to digital converter in which an analog input signal is averaged over a given period of time and the result quantized into a representative number of output pulses. An analog input signal is processed through a plurality of parallel circuits each including an envelope detector and integrator and adapted by means of amplifiers to cover a different sub-range of the maximum dynamic range of the converter. Each of the integrator outputs is connected through a respective analog gate to one input of a signal level comparator. The reference input of the comparator comprises a succession of step voltages generated by a ladder network controlled by a digital counter driven decoder. An OR gate derives converter output pulses from the decoder which correspond in number to the reference voltage steps generated. The outputs of the lower sub-range integrators are coupled to parallel analog comparison and decision circuitry for deriving control signals for the analog gates and the decoder which indicate the highest sub-range within which the incoming analog signal lies. A switch for selecting the reference voltage employed in the parallel comparison enables variation of the dynamic range of the converter. A second counter driven decoder, also controlled by the decision circuitry, provides fill-in pulses at the converter output prior to the fine stepping comparison when the decision control signal indicates an analog input signal level within a dynamic sub-range above the lowest sub-range. Means for changing quantization step size is provided by a switch for connecting an enable voltage level to selected control inputs of both decoders.

10 Claims, 5 Drawing Figures

INVENTOR.
Peter E. Solender
BY Edward J. Coleman
AGENT.

INVENTOR.
Peter E. Solender
BY Edward J. Coleman
AGENT.

INVENTOR.
PETER E. SOLENDER
BY Edward J. Coleman
AGENT.

INVENTOR.
PETER E. SOLENDER
BY Edward J. Coleman
AGENT.

ANALOG TO DIGITAL CONVERTER WITH VARIABLE QUANTIZATION AND DYNAMIC RANGE

BACKGROUND OF THE INVENTION

This invention relates generally to analog to digital converters and, in particular, to circuitry for translating an analog input signal subject to amplitude variations over a wide dynamic range into a number of output pulses representing a logarithmic quantization of the averaged input signal level.

Analog to digital converters are useful in a number of applications; for example, the capabilities of digital computers can be extended by using these circuits as input or output devices, and use at the output of a measuring device provides a readout in convenient digital format. The circuit design of analog to digital converters has taken a variety of forms, most of which, however, are quite complicated and costly. The general approach is to employ a logical matrix keyed by a digital timer in such a manner that the incoming analog signals are compared with a standard voltage successively of diminishing value until any difference in error voltage falls to a predetermined minimum level. The number and type of comparisons form a digital code representative of the analog value. A typical implementation includes an error amplifier for comparing the analog voltage with the output of a standard voltage generator having a stepped output to produce digital code signals corresponding to the successive comparison operations required until equality is reached between the analog voltage and a fractional output of the standard voltage generator. These previous analog to digital circuit designs are adequate for many applications, but are disadvantageous for others in that they are limited to a fixed quantization step size and a fixed and relatively narrow dynamic range.

SUMMARY OF THE INVENTION

With an awareness of the aforementioned disadvantages of the prior art, it is an object of the present invention to provide an improved analog to digital converter.

It is another object of the invention to provide a wide range analog to digital converter having relatively simple and economical means for varying the magnitude of the quantization steps and the dynamic range.

Briefly, these objects are obtained by an analog to digital converter for quantizing an analog signal into a representative number of output pulses comprising: a signal level comparator having first and second inputs; means coupling the analog signal to the first input of the comparator; means for generating successive reference voltage levels in equal logarithmic amplitude steps and applying the reference voltage levels to the second input of the comparator; means for deriving from the reference voltage generator converter output pulses corresponding in number to the reference voltage steps generated; means for selectively changing the size of the reference voltage amplitude steps; and means coupled to the output of the comparator for stopping the generation of reference voltage steps in response to an output signal from the comparator indicating that one of the reference voltage levels exceeds the signal level at the first input of the comparator.

In one aspect of the invention the means for coupling the analog signal to the first input of the comparator comprises at least first and second signal processing circuits adapted to respectively cover complementary sub-ranges of a predetermined dynamic range. The dynamic sub-range of the second signal processing circuit is adapted to cover higher input levels than the sub-range of the first signal processing circuit. A pair of gates are respectively coupled between the outputs of the signal processing circuits and the first input of the comparator. Means is provided for comparing the output of the first signal processing circuit with a selected reference voltage and responsively providing signal level decision information to control the gates. This decision information is also employed to control means for generating a predetermined number of converter output pulses when the decision information indicates an input signal level within the dynamic sub-range of the second signal processing circuit.

BRIEF DESCRIPTION OF THE DRAWINGS

This invention will be more fully described hereinafter in conjunction with the accompanying drawings, in which.

DESCRIPTION OF PREFERRED EMBODIMENT

For a better understanding of the present invention, together with other and further objects, advantages and capabilities thereof, reference is made to the following disclosure and appended claims in connection with the abovedescribed drawings.

In brief, the present invention provides an analog to digital converter having a readily variable step size and dynamic range by employing digital timing and programming circuitry to control a sequential analog to digital operation comprising a parallel analog signal level comparison followed by a series of fine stepping comparisons.

Figure 1:
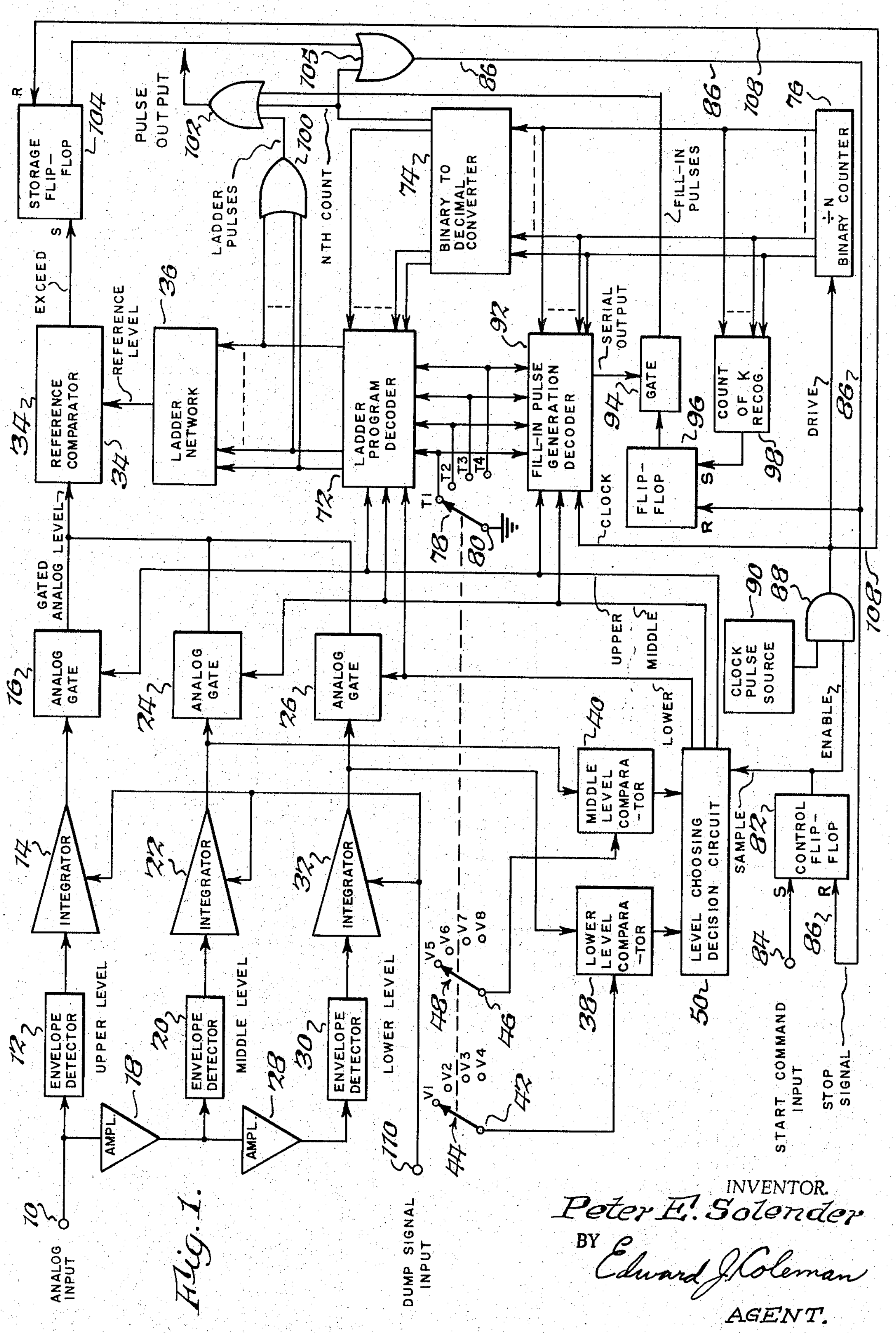
FIG. 1 is a block diagram of an analog to digital converter according to the invention.

Referring to FIG. 1, the analog signal input, represented by terminal 10, is split into three signal processing circuits having three respective levels of amplification. An upper level processing circuit is illustrated as comprising an envelope detector 12 and an integrator 14 serially connected in that order between the analog input terminal 10 and the input of an analog gate circuit 16. A middle level processing circuit comprises an amplifier 18, an envelope detector 20 and an integrator 22 serially-connected in that order between the analog input terminal 10 and the input of an analog gate circuit 24. Connected between the output of amplifier 18 and the input of an analog gate 26 is a lower level processing circuit comprising amplifier 28, envelope detector 30 and integrator 32. Splitting up the processing of the analog input in this manner enables a relatively wide dynamic range to be covered by using a linear detection process and reasonable detector voltage ranges in each of the three envelope detectors and integrators. Each of the detectors 12, 20 and 30 may be designed to have equivalent linear operating ranges. Amplifiers 18 and 28 each have a signal gain of $x$ db, so that an $x$ db signal at detector 30 will be 0 db at detector 20, and an $x$ db signal at detector 20 will appear as a 0 db signal at detector 12. Accordingly, by virtue of processing the analog input signal through amplifiers 18 and 28, detectors 12, 20 and 30 are adapted to cover three complementary sub-ranges of the predetermined dynamic range of the converter. As the processing circuit including detector 30 has the highest level of amplification, it covers the lowest sub-range of signal levels applied at terminal 10. Detector 12, having the lowest level of amplification at its input, covers the upper sub-range of signal levels applied at terminal 10. This leaves detector 20 to cover the middle sub-range of signal levels between those covered by the upper and lower level processing circuits, in view of the intermediate level of amplification at its input.

The outputs of integrators 14, 22 and 32 are respectively coupled through gates 16, 24 and 26 to one input of a reference comparator 34, which may comprise a conventional difference amplifier circuit or an integrated circuit operational amplifier design, referred to as a differential comparator. The reference comparator has two states depending on which of its two inputs is larger in voltage. The second input to comparator 34 is provided by a ladder network 36 for generating successive reference voltage levels in equal logarithmic amplitude steps in response to selective application of control pulses to a plurality of gating circuits in the network. A typical ladder network construction will be described hereinafter in connection with an operational description of the converter.

The outputs of the middle level integrator 22 and the lower level integrator 32 are also respectively connected to signal level comparators 38 and 40 for comparison with respective reference voltage levels selected by a rotary switch. In particular, the second input of lower level comparator 38 is connected to the common terminal 42 of a single-pole multiple-throw switch 44, which is illustrated as being operative to selectively connect the second input of comparator 38 to one of four voltage sources represented by terminals V1, V2, V3 and V4. The reference input of the middle level comparator 40 is connected to the common terminal 46 of a switch 48 which is mechanically coupled to switch 44 and operative to make connection with a selected one of four voltage sources represented by terminals V5, V6, V7 and V8.

The outputs of comparators 38 and 40 are coupled to a level choosing decision circuit 50 which is thereby responsive to provide signal level information indicative of the highest sub-range within which a converter input signal lies. In this instance, decision circuit 50 provides three output signals respectively indicative of analog input signals lying in the lower, middle or upper level sub-range. Accordingly, the lower level decision output of circuit 50 is applied to control the operation of gate 26; the middle level output of the decision circuit is applied to control gate 24; and the upper level decision output is applied to control analog gate 16. By virtue of this parallel signal level comparison and gate control arrangement, switches 44 and 48 are operative to vary the threshold levels of the lower and middle level comparators 38 and 40, respectively, and thereby provide a simplified means for varying the dynamic range of the converter, as will be illustrated in detail hereafter.

Figure 2:
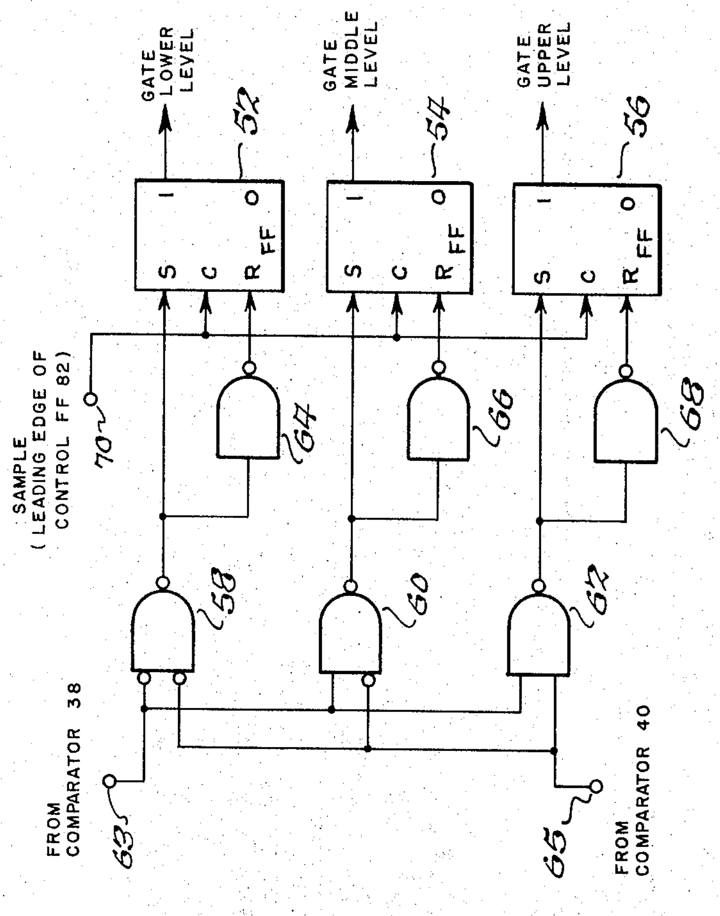
FIG. 2 is a block diagram of a level choosing decision circuit useful in the converter of FIG. 1.

A preferred implementation of decision circuit 50 is illustrated by the logic diagram of FIG. 2. The circuit includes three flip-flops 52, 54 and 56 for respectively providing lower, middle and upper level gating signals. Each of the flip-flops includes set, clock and re-set inputs denoted by the letters S, C, and R, respectively. The gating outputs are illustrated as being taken from the 1 output of each of the flip-flops. The set inputs of flip-flops 52, 54 and 56 are controlled by respective NAND gates 58, 60 and 62, each of which has inputs from comparators 38 and 40. Specifically, the output of comparator 38, represented by terminal 63, is connected directly to inputs of NAND gates 60 and 62 and to an inverter at the input of gate 58. Comparator 38 provides signal levels indicating whether or not the output of the lower level integrator 32 exceeds the selected reference voltage level. The output of comparator 40, represented by terminal 65, is connected directly to the input of NAND gate 62 and to respective inverters at the inputs of gates 58 and 60. Comparator 40 provides signals indicating whether the middle level output of integrator 22 exceeds or does not exceed its selected input reference level. Coupled between the outputs of the NAND gates and the reset inputs of the flip-flops are respective NAND gates 64, 66 and 68 which function as inverters.

NAND gate 58 is designed to provide a true output signal to the set terminal of flip-flop 52 in response to input signals from the lower and middle level comparators indicating that neither of the reference threshold levels have been exceeded. In this event, inverter 64 is operative to provide a false output signal to the reset input of the flip-flop. Of course, a reference exceedence signal at either of the inputs of NAND gate 58 will result in application of a false signal to the set input of flip-flop 52, and via inverter 64 a true signal will be applied to the reset input of the flip-flop.

NAND gate 60 is designed to provide a true output to the set terminal of flip-flop 54 when its inputs indicate that the reference threshold for the lower level comparator 38 has been exceeded, but that the middle level threshold has not been exceeded. Finally, NAND gate 62 will provide a true output to the set terminal of flip-flop 56 when its inputs indicate that the reference thresholds of both the lower and middle level comparators have been exceeded. Inverter NAND gates 66 and 68, of course, function similarly to inverter 64. The flip-flops will change state in accordance with the inputs applied to their respective set and reset terminals only upon application of a sample transition signal to the clock inputs of the flip-flops via terminal 70.

In operation, if the analog input signal at terminal 10 lies within the lower level sub-range established by amplifiers 18 and 28 and the selected reference signal to comparator 38, neither of the reference threshold levels of comparators 38 and 40 will be exceeded. Accordingly, NAND gate 58 will provide a true output, and NAND gates 60 and 62 will provide false outputs. Upon application of a sample transition to the clock inputs of the flip-flops, therefore, flip-flop 52 will be placed in the set condition, and flip-flops 54 and 56 will be reset. As a consequence, only gate 26 will be activated to permit the output of the lower level integrator 32 to be applied to the reference comparator 34.

In the event the analog input signal at terminal 10 lies within the middle level sub-range, as determined by amplifier 18 and the reference threshold levels of comparators 38 and 40, the threshold of the lower level comparator 38 will be exceeded and the middle level threshold will not be exceeded. The output of NAND gate 60 will then be true, whereas the outputs of NAND gates 58 and 62 will be false, such that the sample transition clocks flip-flop 54 to the set condition and resets flip-flops 52 and 56. The resulting stored output levels of the flip-flops will then cause only gate 24 to be activated, thereby permitting the averaged signal from middle level integrator 22 to be applied to the reference comparator 34.

If the analog input is in the upper level sub-range, the output of NAND gate 62 will be true, while the outputs of NAND gates 58 and 60 will be false. Upon application of the sample transition, flip-flop 56 will be set and flip-flops 52 and 54 will be reset, thereby permitting only analog gate 16 to be activated for permitting the output of the upper level channel to be gated to the reference comparator input.

The reference voltage steps generated by ladder network 36 are programmed by a decoder 72 having a plurality of output lines respectively coupled to the inputs of the ladder network. Decoder 72 has a plurality of drive inputs coupled to a binary to decimal converter 74, which in turn is driven by the parallel output of a ÷N binary counter 76. Decoder 72 also has two sets of control inputs, one comprising the lower, middle and upper level indicating signals from decision circuit 50. The second set of decoder 72 inputs are adapted to be selectively connected to ground via a single-pole multiple-throw switch 78, which is mechanically coupled to switches 44 and 48. More specifically, each of the second set of decoder input lines is connected to a respective one of the terminals T1, T2, T3 and T4 of switch 78, with only one of the terminals T1–T4 being connected via the common terminal 80 to ground.

In operation, the binary output of counter 76 is transformed to decimal form by the converter 74 whereby pulses are sequentially applied to the drive inputs of decoder 72. The control inputs from decision circuit 50 and switch 78 function as enabling signals for selectively gating the output pulses from converter 74 to respective control inputs of the ladder network, thereby controlling the size of the reference voltage amplitude steps generated therefrom and applied to comparator 34. Accordingly, decoder 72 may be implemented as a matrix of AND gates each having three inputs and a single output. More specifically, a first set of AND gates may be connected to a first pulse output line of converter 74, while a second set of AND gates may be connected to the second pulse output line of converter 74, and so on. The outputs of each set of AND gates would be coupled through an OR gate to a respective input of the ladder network. Thus, for n converter 74 output lines to decoder 72, there would be *m* corresponding sets of AND gates and m corresponding ladder network inputs. A first gate in each of the sets would have enable inputs coupled to terminal T1 of switch 78 and the lower level output line of decision circuit 50; a second gate in each of the sets would have enable inputs coupled to the T1 terminal of switch 78 and the middle level output line of decision circuit 50; and the third AND gate in each set would be connected to terminal T1 and the upper level output of the decision circuit. A fourth gate in each set would be connected to switch terminal T2 and the lower level decision output; a fifth gate in each set would be connected to terminal T2 and the middle level decision output; and a sixth gate in each set would be connected to terminal T2 and the upper level decision output. In like manner, six more gates in each set would have respective enable input combinations of T3-lower level, T3-middle level, T3-upper level, T4-lower level, T4-middle level, and T4-upper level. In this manner, it is readily apparent that switch 78 provides a very simplified means for selectively changing the size of the reference voltage amplitude steps applied to comparator 34.

The duration of the conversion process is controlled by a flip-flop circuit 82 having a set input connected to a "start command" input terminal 84 and a reset input connected to line 86. The output of control flip-flop 82 is connected to the sample input of decision circuit 50, e.g. terminal 70 in FIG. 2, and to the enable input of an AND gate 88, the other input of which is connected to a clock pulse source 90. The output of NAD gate 88 is connected to the drive input of counter 76, so that when gate 88 is enabled, clock 90 provides the drive rate for the conversion process.

Converter operation is initiated by the application to input terminal 84 of an externally generated start command signal, which may be automatically cycled at a continuous rate or manually controlled. Upon being triggered to the set condition by the start command, the voltage level transition produced at the output of control flip-flop 82 is employed as the sampling signal for decision circuit 50, and the set level produced by flip-flop 82 enables AND gate 88 to permit clock source 90 to drive counter 76. In counting toward N, circuit 76 controls the sequential activation of the analog to digital conversion process. An initial portion of this count is reserved for activating the generation of fill-in pulses (after) the parallel signal level comparison but prior to the fine stepping signal level comparison by circuit 34. When the analog input signal lies in the middle level sub-range, it is desired that a predetermined number of converter output pulses be generated to represent fill-in pulses corresponding in number to the amplitude increments of the selected reference voltage step size which lie within the lower level sub-range. Likewise, if the analog input lies within the upper level sub-range, it is desired that fill-in pulses be generated which correspond in number to the selected amplitude increments which lie within both the lower and middle level sub-ranges. Thereafter, ladder network 36 generates successive reference voltage levels of increasing amplitude for comparison with the gated analog level, and converter output pulses are derived which correspond in number to the reference voltage steps generated.

The means for generating fill-in pulses comprises a decoder 92 for gating clock pulses derived from AND gate 88 in response to enabling control inputs from decision circuit 50, switch 78 and counter 76. Hence, decoder 92 may comprise a matrix of AND gates, with an OR gate for combining the AND gate output to provide a serial output from the decoder. For example, one of the decoder 92 AND gates would have a clock input, an input coupled to the middle level signal output of decision circuit 50, an input coupled to terminal T1 of switch 78, and an input coupled to selected outputs of the binary counter 76. More specifically, the AND gate would be connected to the counter stage or stages which during the first K counts, where K is less than N, would enable the AND gate to allow the desired number of clock pulses to pass to the serial output of decoder 92. This AND function of the decoder 92 is further clarified hereinafter by the use of illustrative values in an operational description of the converter.

The first K counts of ÷N circuit 76 are isolated from the ladder program decoder 72 by means of the binary to decimal converter 74 so as not to generate reference steps from the ladder network during the period that fill-in pulses are generated. That is, the binary to decimal converter is designed to produce a pulse on an appropriate one of its parallel outputs only in response to a binary input representing counts from K + 1 to N. On the other hand, it is desired to inhibit the generation of fill-in pulses from decoder 92 during the counts from K + 1 through N. This function is provided by an output gate 94 controlled by a flip-flop 96 having its set input controlled by a count of K recognition circuit 98. The recognition circuit may be of the conventional type comprising a matrix of diodes connected to the parallel outputs of binary counter 76 and arranged to produce an output recognition signal when the binary states of the counter stages indicate a count of K. When flip-flop 96 is in the reset condition, its output is operative to activate gate 94 to permit serial output pulses from decoder 92 to pass to the converter output, whereas the output of flip-flop 96 when in the set condition causes gate 94 to inhibit the serial output of decoder 92. Thus, assuming flip-flop 96 is initially in the reset condition, gate 94 will permit generated fill-in pulses to pass to the converter output until the ÷ N circuit 76 reaches a count of K. Upon recognizing the count of K, circuit 98 produces a signal which triggers flip-flop 96 into the set condition. As a result, gate 94 prevents the generation of fill-in pulses during the K + 1 count and all subsequent counts.

As previously mentioned, counts from K + 1 through N are operative via converter 74 and decoder 72 to activate the generation of successive reference voltage steps. As each different reference voltage step is activated by a pulse on one of the input lines from decoder 72 to ladder network 36, the desired derivation of converter output pulses, corresponding in number to the generated reference voltage steps, is provided by an OR gate 100 having a plurality of inputs respectively connected to the outputs of decoder 72.

In order to provide a composite analog to digital pulse output for the converter, the ladder pulses from OR gate 100 and the fill-in pulses from gate 94 are combined in a final output OR gate 102. Also connected to the input of OR gate 102 is the output line of the binary to decimal converter upon which a pulse is produced at the Nth count of the binary counter 76. In this manner, the Nth count pulse is used as a dummy output pulse for purposes which are best made clear in the illustrative operational description hereinafter.

The end of the analog to digital operating cycle is indicated when reference comparator 34 produces an output signal indicating that one of the reference voltage levels from the ladder network exceeds the gated analog signal level. In order to stop the further generation of the reference voltage steps and converter output pulses, the output of comparator 34 is connected to the set input of a storage flip-flop 104, which is operative in the set state to produce a stop signal output which is connected via OR gate 105 and line 86 to the reset inputs of flip-flops 82 and 96. In this manner, the stop signal is operative via reset control flip-flop 82 to inhibit the application of further clock pulses to binary counter 76 and to reset flip-flop 96 so that gate 94 will be activated at the beginning of the next operational cycle. The reset input of storage flip-flop 104 is connected via line 108 to the output of AND gate 88 so that upon receipt of the next start command signal, the first clock pulse passed by gate 88 will reset the storage flip-flop to remove the stop signal and permit normal operation.

Each of the integrators 14, 22 and 32 is adapted to have its output reduced to zero in response to a dump control signal applied thereto via terminal 110. The dump signal is applied after the analog to digital processing is completed so as to clear the integrators for another averaging and conversion process. There are a number of alternative methods for applying the dump signal. For example, the dump signal may be activated by an operator at the end of the conversion process. Then again, if the converter is intended to operate at a steady rate within a system, a rectangular waveform signal could be applied at dump terminal 110 to control the integration and dump periods, with an appropriately correlated start command signal being applied to terminal 84. As another alternative, the dump period could be controlled by a monostable triggered by the stop signal.

Operation of the analog to digital converter of FIG. 1 will now be described with the use of some typical circuit values and system parameters in order to more clearly illustrate the conversion process. It is to be understood, however, that these specific values and parameters are employed for purposes of example only, and are not to be construed as limiting the scope of the invention.

Consider a preferred embodiment of FIG. 1 wherein operation of the converter is adjustable by means of the mechanically linked rotary switches 44, 48 and 78 to cover dynamic ranges of 30 db, 40 db, 51 db or 60 db in ten logarithmic steps, generally of 3 db, 4 db, 5 db or 6 db each, respectively. The first, ninth and tenth steps of each range actually vary from these values as follows: the first step represents input signal levels below 0 db; the tenth step represents input signal levels above the maximum figure for that range; and the ninth step of each range is approximately three times the assigned step size for the range. The dynamic range figure of 51 db was selected for purposes of digital logic implementation convenience.

Accordingly, voltage source terminal V1 of switch 44, voltage source terminal V5 of switch 48, and terminal T1 of switch 78 are associated with the 30 db range and 3 db quantization steps. Switch terminals V2, V6, and T2 are associated with the 40 db range and 4 db steps; terminals V3, V7 and T3 correspond to the 51 db range and 5 db steps; and terminals V4, V8 and T4 establish the 60 db range and 6 db step size. Each of the envelope detectors 12, 20 and 30 have a range of 24 db, and each of the amplifiers 18 and 28 provide a gain of 18 db. Hence, an 18 db signal at the lower level detector will be 0 db at the middle level detector, and an 18 db signal at the middle level detector will be 0 db at the upper level detector.

In overall operation, the analog input signal at terminal 10 is applied in parallel to the three signal processing circuits for envelope detector and integration, or averaging, over a selected period of time. The integration period may be determined by gating the analog input at terminal 10 and applying the dump signal to terminal 110 at the end of the desired integration period. Alternatively, as previously mentioned, the integration and dump cycle may be at a steady rate as determined by a rectangular waveform signal applied to the dump input terminal 110. Near the end of the integration period, the output of one of the integrators is sampled by a selected one of the analog gates in response to application of a start command signal to the control flip-flop 82. As previously noted, the start command signal may be operator-controlled or applied by an external system clock at a steady rate in appropriate correlation with the dump signal. For example, the integrate period may be 800 milliseconds; the sample period may be timed to occur during the last 1.8 milliseconds of the integrate period; and a dump period of 0.4 milliseconds may be timed to occur at the termination of the integrate period. During the sample period initiated by the start command input, one of the analog gates 16, 24 or 26 samples the averaged signal at the output of the integrator to which it is connected, and the analog to digital converter operation proceeds as a series of successive comparisons which produce converter output pulses proportional in number to the power level of the analog input signal.

tal number output (number of pulses generated during the sample period) for denoted analog input signal levels (db above a given reference level) for each of four possible dynamic ranges and corresponding step sizes of 3 db, 4 db, 5 db and 6 db, respectively. This chart also shows the full dynamic range split into three sub-ranges, one for each of the three detectors, designated lower level, middle level and upper level. Each ladder pulse number indicated on the chart, except No. 15 (which is described later) refers to one of 14 parallel inputs of the ladder network 36 to which a gating signal pulse is applied to produce a reference voltage level for comparison with the analog input; this process will be explained further on. An important simplifying factor shown in Table 1 is that the 3 db and 4 db step operations (the 30 db and 40 db dynamic ranges) do not use the upper level sub-range.

The decision as to which of the three analog input sub-ranges to use is made in the level choosing decision circuit 50 on the basis of the level comparisons made at the outputs of the lower and middle level integrators 22 and 32. The signal level comparison performed by the lower level comparator 38 is made with respect to

TABLE 1

| 3 db Steps | | | | 4 db Steps | | | |
|---|---|---|---|---|---|---|---|
| Sub-Ranges | Analog Input | Digital Output | Ladder Pulse No. | Sub-Ranges | Analog Input | Digital Output | Ladder Pulse No. |
| ↑ | | 0 | | ↑ | | 0 | |
| | 0 – 3 db | 1 | 1 | | 0 – 4 db | 1 | 2 |
| Lower | 3 – 6 db | 2 | 4 | Lower | 4 – 8 db | 2 | 5 |
| Level | 6 – 9 db | 3 | 6 | Level | 8 – 12 db | 3 | 8 |
| | 9 – 12 db | 4 | 8 | | 12 – 16 db | 4 | 10 |
| | 12 – 15 db | 5 | 9 | ↓ | 16 – 20 db | 5 | 12 |
| ↓ | 15 – 18 db | 6 | 11 | ↑ | 20 – 24 db | 6 | 4 |
| ↑ Middle | 18 – 21 db | 7 | 1 | Middle | 24 – 28 db | 7 | 7 |
| Level | 21 – 30 db | 8 | 8 | Level | 28 – 40 db | 8 | 13 |
| ↓ | > 30 db | 9 | 15 | ↓ | > 40 db | 9 | 15 |
| 5 db Steps | | | | 6 db Steps | | | |
| ↑ | | 0 | | ↑ | | 0 | |
| | 0 – 5 db | 1 | 3 | Lower | 0 – 6 db | 1 | 4 |
| Lower | 5 – 10 db | 2 | 7 | Level | 6 – 12 db | 2 | 8 |
| Level | 10 – 15 db | 3 | 9 | ↓ | 12 – 18 db | 3 | 11 |
| ↓ | 15 – 20 db | 4 | 12 | ↑ | 18 – 24 db | 4 | 4 |
| ↑ Middle Level | 20 – 25 db | 5 | 3+2 | Middle Level | 24 – 30 db | 5 | 8 |
| | 25 – 30 db | 6 | 8 | ↓ | 30 – 36 db | 6 | 11 |
| ↓ | 30 – 35 db | 7 | 10+4 | ↑ | 36 – 42 db | 7 | 4 |
| ↑ Upper | 35 – 51 db | 8 | 9 | Upper | 42 – 60 db | 8 | 14 |
| Level ↓ | > 51 db | 9 | 15 | Level ↓ | > 60 db | 9 | 15 |

The first step is to determine which integrator output to sample and process. This decision is based on the dynamic range of the detectors and the particular dynamic range which the system is required to cover. The former is fixed and is the property of each detector; while the latter is determined by the mechanically linked rotary switches which are set to one of the four positions corresponding to the required dynamic range of 30 db, 40 db, 51 db or 60 db. Table 1 shows the digia threshold setting, or reference input level, provided by switch 44, while middle level comparator 40 has a threshold input established by switch 48. The threshold settings provided to the level comparators for each of the dynamic ranges selected by switches 44 and 48 are shown in Table 2 below:

TABLE 2

| | 30 db Range (3 db Steps) | 40 db Range (4 db Steps) | 51 db Range (5 db Steps) | 60 db Range (6 db Steps) |
|---|---|---|---|---|
| Threshold for Comparator 38 | 18 db | 20 db | 20 db | 18 db |
| Threshold for Comparator 40 | None | None | 17 db | 18db |

These threshold settings, expressed in decibels (db) above a given reference voltage, are derived from Table 1, recalling that 18 db at the lower level detector is 0 db at the middle level detector. Thus, switch terminal V1 represents a voltage source 18 db above a given reference voltage level; terminals V2 and V3 each represent a voltage source 20 db above the reference level; terminals V4 and V8 each represent an 18 db voltage source; and terminal V7 represents a voltage source 17 db above the reference. The "none" threshold denotation means that switch terminals V5 and V6 each represent a voltage source sufficiently high to preclude a threshold exceedence during normal operation. If the lower level threshold is not exceeded, it is apparent that the signal lies in the lower level sub-range. However, if the lower level threshold is exceeded, and the middle level threshold is not exceeded, it is apparent that the signal lies in the middle level sub-range. Exceedence of the middle level threshold indicates that the input signal is located in the upper level sub-range. As previously described with reference to FIG. 2, this threshold exceedence information is processed and stored by decision circuit 50 upon receipt of the sampling signal transition from control flip-flop 82.

If the threshold decision indicates that the analog input signal lies in any sub-range other than the lowest level, a number of fill-in pulses are produced. These pulses take the place of those pulses which would have been produced had the lower level or middle level been processed through the fine stepping reference comparator 34. The number of fill-in pulses required for each of the step size and sub-range conditions may readily be determined from Table 1; however, for convenience this information is summarized in Table 3 below:

TABLE 3

| Dynamic Range/Step Size | | Sub-Range Threshold Decision | No. of Fill-In Pulses Required |
|---|---|---|---|
| 30 db | 3 db | Lower Level | 0 |
| 30 db | 3 db | Middle Level | 6 |
| 40 db | 4 db | Lower Level | 0 |
| 40 db | 4 db | Middle Level | 5 |
| 51 db | 5 db | Lower Level | 0 |
| 51 db | 5 db | Middle Level | 4 |
| 51 db | 5 db | Upper Level | 7 |
| 60 db | 6 db | Lower Level | 0 |
| 60 db | 6 db | Middle Level | 3 |
| 60 db | 6 db | Upper Level | 6 |

The fill-in pulses are produced by decoder 92 and applied via the enabled gate 94 to the output OR gate 102 in the correct number and at the proper time in accordance with control inputs from switch 78, decision circuit 50, and binary counter 76. In this particular example, counter 76 is a five stage divide-by-24 digital counter. The time sequencing function of the counter is provided by reserving the first nine counts for fill-in pulse generation, using counts ten through twenty-three to sequentially drive the ladder program decoder 72 via binary to decimal converter 74, and employing the twenty-fourth count to produce a dummy output pulse from converter 74. In binary format, with a 16-8-4-2-1 decimal weighting, the five parallel outputs of the five stage counter 76 may be expressed as ranging from 00000 to 10111 over the twenty-four counts, this being equivalent to a range from 0 to 23 in decimal form. Accordingly, circuit 98 recognizes a binary output of 01000 (decimal 8) as the ninth count and is thereupon operative to trigger flip-flop 96 to the set condition and, thus, causes gate 94 to inhibit the pulse output of decoder 92. For convenience, the binary output and corresponding decimal number for the first nine counts of counter 76 are provided in Table 3A below:

TABLE 3A

| OUTPUT DECIMAL NO. | BINARY WEIGHTING OF COUNTER STAGES | | | | | COUNT |
|---|---|---|---|---|---|---|
| | 16 | 8 | 4 | 2 | 1 | |
| 0 | 0 | 0 | 0 | 0 | 0 | 1st |
| 1 | 0 | 0 | 0 | 0 | 1 | 2nd |
| 2 | 0 | 0 | 0 | 1 | 0 | 3rd |
| 3 | 0 | 0 | 0 | 1 | 1 | 4th |
| 4 | 0 | 0 | 1 | 0 | 0 | 5th |
| 5 | 0 | 0 | 1 | 0 | 1 | 6th |
| 6 | 0 | 0 | 1 | 1 | 0 | 7th |
| 7 | 0 | 0 | 1 | 1 | 1 | 8th |
| 8 | 0 | 1 | 0 | 0 | 0 | 9th |

Figure 5:
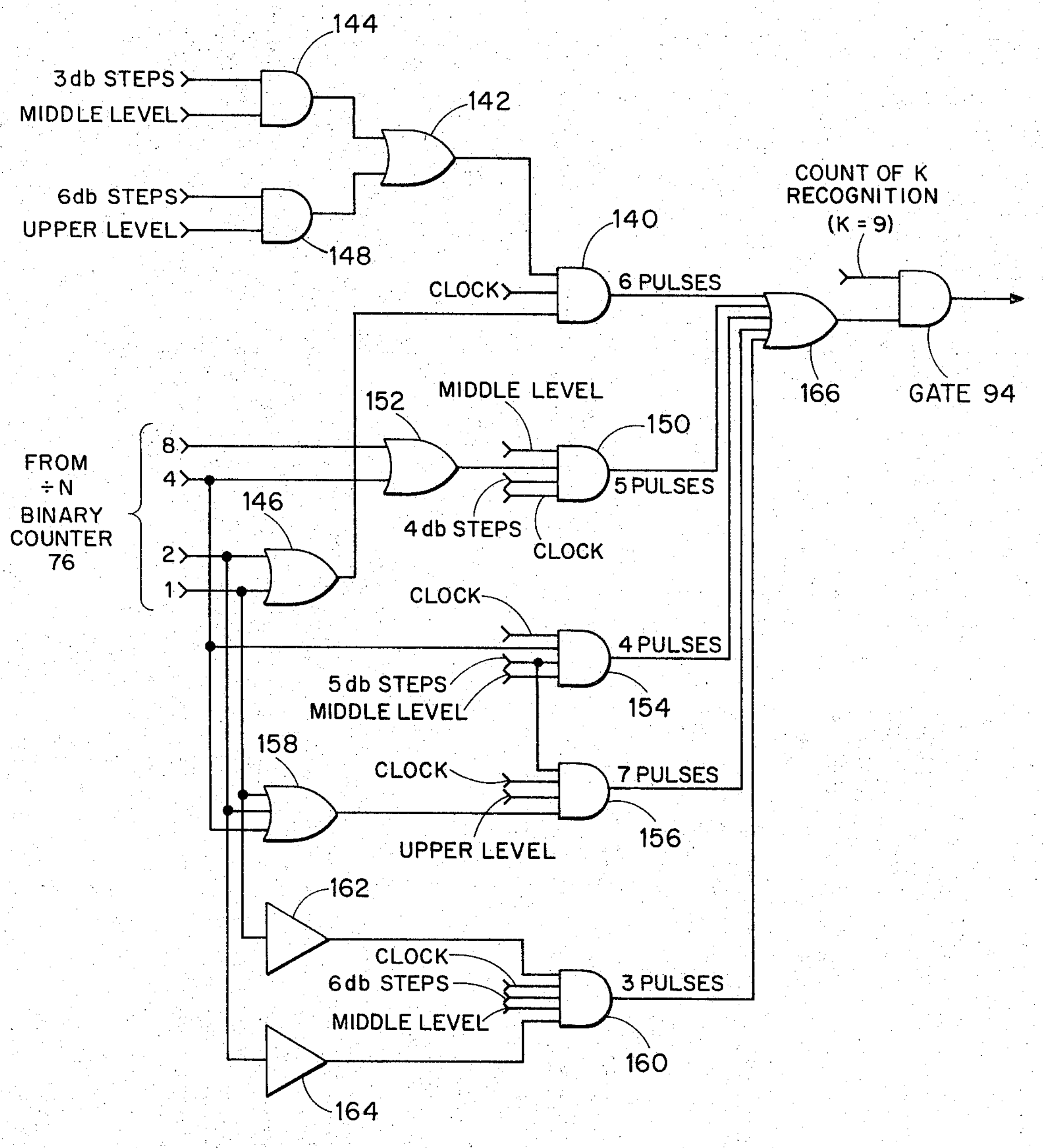
FIG. 5 is a logic diagram of a fill-in pulse generation decoder useful in the converter of FIG. 1.

In view of Tables 3 and 3A the AND gate logic of decoder 92 may be described as follows. Referring to FIG. 5, decoder 92 may basically comprise a matrix of AND gates 140, 150, 154, 156 and 160 having outputs to a common output OR gate 166. OR gate 166 represents the output of decoder 92 and is connected to gate 94. The inputs to the AND gate matrix may be provided through combining logic elements as illustrated. The inputs denoted as 3db, 4db, 5db and 6db steps are obtained from terminals T1, T2, T3 and T4, respectively, of switch 78. The "middle level" and "upper level" signals are obtained from the level choosing decision circuit 50; the clock pulses are obtained from gate 88; and the "count of K recognition" gating signal is obtained from flip-flop 96. As signal levels lying in the lower sub-range require no fill-in pulses, decoder 92 includes no AND gates responsive to lower level threshold decision signals. The generation of six fill-in pulses may be provided by an AND gate 140 having the following input connections: one enabling input connected to the 3 db switch terminal T1; and the middle level decision output of circuit 50 via OR gate 142 and AND gate 144; another enabling input connected to the output of an OR gate 146 having inputs connected to the first and second stages of counter 76; and a clock pulse input from AND gate 88. As the first and second stages of the counter are the "1 weight" and "2 weight" stages respectively, it will be noted that at least one of these stages will be in the binary 1 state during the occurrence of six clock pulses over the period that counter 76 is counting from 00000 to 01000. If the 1 level is employed as the OR gate 146 enabling level, therefore, OR gate 146 will enable AND gate 146 to allow only six clock pulses to pass to the output of decoder 92 before gate 94 is inhibited in response to a count of nine.

AND gate 140 may also provide six fill-in pulses by virtue of an alternative enabling input connection via OR gate 142 and AND gate 148 to the 6 db switch terminal T4 and the upper level decision output of circuit 50.

Likewise, five fill-in pulses may be provided by an AND gate 150 having a clock input, a first enable input connected to the middle level output of decision circuit 50, a second enable input connected to the 4 db switch terminal T2, and a third enable input connected to the output of an OR gate 152 having inputs connected to the third and fourth stages of counter 76 (letting these stages be the "4 weight" and "8 weight" stages respectively). The AND gate 154 for generating four fill-in pulses has a clock pulse input, a first enable input connected to 5 db switch terminal T3, a second enable input connected to the middle output of decision circuit 50, and a third enabling input connected to third stage of counter 76. Seven fill-in pulses may be provided by an AND gate 156 having a clock input, a first enable input connected to 5 db switch terminal T3, a second enable input connected to the upper level output of decision circuit 50, and a third enable input coupled to the output of an OR gate 158 having inputs connected to the first, second and third counter stages. Finally, the AND gate 160 for providing three fill-in pulses has the following input arrangement: a clock pulse input; a first enable input coupled to 6 db switch terminal T4; a second enable input connected to the middle level output of decision circuit 50; and third and fourth inputs respectively coupled to the first and second counter stages via inverters 162 and 164, respectively, so as to be enabled by 0 level inputs. It will be noted that the first two counter stages will simultaneously be in the 0 state three times during the count from 00000 to 01000.

As previously mentioned, the fill-in pulses generated during the count to nine form the first component of the composite analog to digital converter output pulses. The other component of the converter output can be thought of as a set of pulses which fine adjust the digital output number. These pulses are generated by program decoder 72 and applied via OR gates 100 and 102 to the converter output as decoder 72 produces gating signals for the generation of reference level voltage steps from the ladder network 36.

The "fine adjust" operation proceeds as follows. In addition to controlling decoders 72 and 92, the output signals from the sampled decision circuit 50 are also operative to activate one of the three analog gates 16, 24 and 26 according to the input signal level decision. The gated analog voltage level is compared with a given 0 db reference voltage level which is generated from the ladder network 36 prior to the tenth count. If this gated analog level is less than the given 0 db voltage level, reference comparator 34 will indicate a reference exceedence, thereby triggering storage flip-flop 104 to produce a stop signal. Hence, the analog to digital operation is completed with a digital output of 0, thereby indicating an analog input level at terminal 10 which is below 0 db. If, however, the gated analog level is greater than the 0 db reference voltage, comparator 34 will not produce an exceedence indication, and the analog to digital operation will continue.

Following the initial 0 db comparison, the analog to digital operation comprises a succession of comparisons with stepped reference voltage levels produced by ladder network 36 in response to gating signals sequentially and selectively applied by decoder 72 while binary counter 76 is proceeding from the tenth count toward the twenty-fourth count. For purposes of description, the gating signal pulses produced by decoder 72 are assigned numbers, each of which corresponds to the particular input of the fourteen parallel input ladder network to which the pulse is applied. Each pulse number applied to the ladder network produces an analog output which is a specific level above the 0 db reference level, as shown in Table 4 below:

TABLE 4

| Ladder Pulse Number | Analog Output Level | Ladder Pulse Number | Analog Output Level |
|---|---|---|---|
| 1 | 3 db | 9 | 15 db |
| 2 | 4 db | 10 | 16 db |
| | | 10+4 | 17 db |
| 3 | 5 db | 11 | 18 db |
| 4 | 6 db | 12 | 20 db |
| 3+2 | 7 db | | |
| 5 | 8 db | 13 | 22 db |
| 6 | 9 db | 14 | 24 db |
| 7 | 10 db | 15 | None |
| 8 | 12 db | | |

Figure 3:
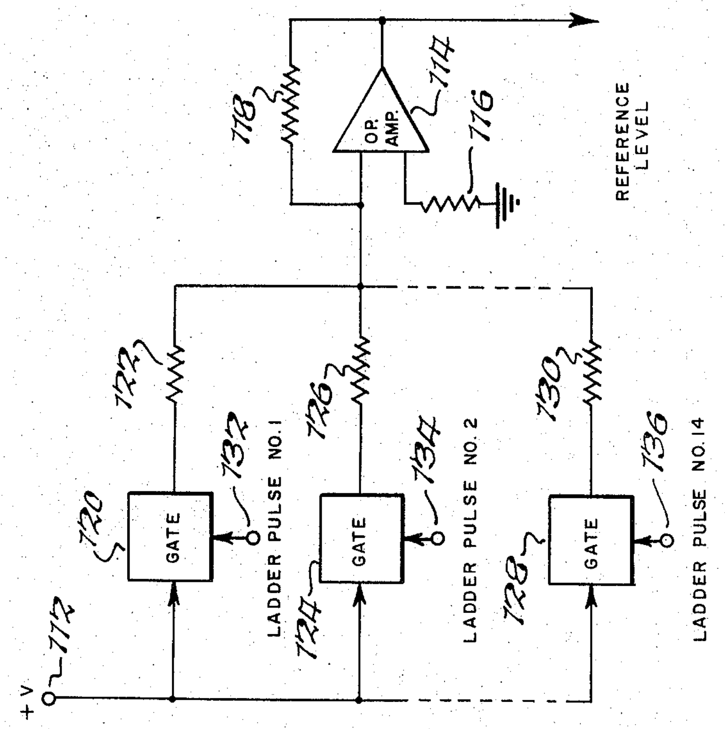
FIG. 3 is a block diagram of a ladder network useful in the converter of FIG. 1.

A typical implementation for ladder network 36 is illustrated in FIG. 3. The analog output reference level is produced by the selective gating of a direct current (DC) voltage source, represented by terminal 112, via a parallel resistor network to the input of an operational amplifier 114. Amplifier 114 has one input tied to ground via resistor 116 and has a feedback resistor 118 connected between its input and output terminals. The first gated resistance path to the input of amplifier 114 comprises a gate 120 and a resistor 122 serially connected in that order between voltage terminal 112 and the amplifier input. The second resistance path includes the serial combination of a gate 124 and a resistor 126, and the fourteenth resistance path includes gate 128 and resistor 130. The fourteen resistance path gates are respectively controlled by the fourteen ladder pulse outputs of decoder 72. Thus, gate 120 is illustrated as having a control terminal 132 to which the ladder pulse No. 1 output of decoder 72 is applied. Gate 124 has a control terminal 134 connected to the ladder pulse No. 2 output line from decoder 72, and gate 128 has a control terminal 136 connected to the ladder pulse No. 14 output of the decoder.

The voltage level produced at the output of amplifier 114 is equal to the voltage at terminal 112 multiplied by the ratio of the value of resistor 118 to the value of the gated resistance. Hence, as indicated by Table 4, when decoder 72 produces ladder pulse No. 1, Gate 120 is activated to apply the voltage source at terminal 112 to the input of operational amplifier 114 via resistor 122, whereby the operational amplifier produces an output voltage level which is 3 db above the 0 db reference level. This represents the ladder network output and is applied as the reference level input to comparator 34. If decoder 72 generates ladder pulse No. 14, gate 128 is activated to connect resistor 130 to the terminal 112 voltage source, thus causing a 24 db output level to be produced by the operational amplifier. In order to produce a 7 db output level from amplifier 114, the decoder simultaneously applies ladder pulses No. 2 and No. 3 to the respective resistance network gates.

The order in which decoder 72 sequentially feeds the pulse numbers to the appropriate ladder network inputs is controlled by the setting of switch 78 and the threshold decision signal produced by circuit 50. Table 1 shows an ordered list of the ladder pulse numbers applied for each step size setting of switch 78. As described in general hereinbefore, the decoder 72 programming functions required by Table 1 may be implemented by a matrix of AND gates having inputs from decision circuit 50, switch 78 and binary to decimal converter 74. The previous general description indicated that a set of twelve AND gates, each providing for one of the twelve enabling combinations, were connected to each of the outputs from converter 74, except for the tenth count output. In the specific case represented by Table 1, there are 14 outputs from the binary to decimal converter applied to decoder 72, thereby seeming to require a 14 by 12 matrix of 168 AND gates. The set of AND gates connected to the converter 74 output which produces a pulse during the tenth count would be connected to the pulse No. 1 input of the ladder network; the eleventh count output line of converter 74 would be connected to the set of AND gates prodiving the pulse No. 2 input to the ladder network; and so on through to the twenty-third count output of converter 74, which is connected to a set of AND gates having outputs connected to the pulse No. 14 input of the ladder network. In operation, therefore, the tenth through twenty-third count output pulses are selectively gated through decoder 72 as ladder pulses No. 1 through No. 14, respectively. With respect to actual implementation, however, it is clear from a study of Table 1 that the decoder program functions required thereby may be provided by a matrix having much less than 168 AND gates.

Figure 4:
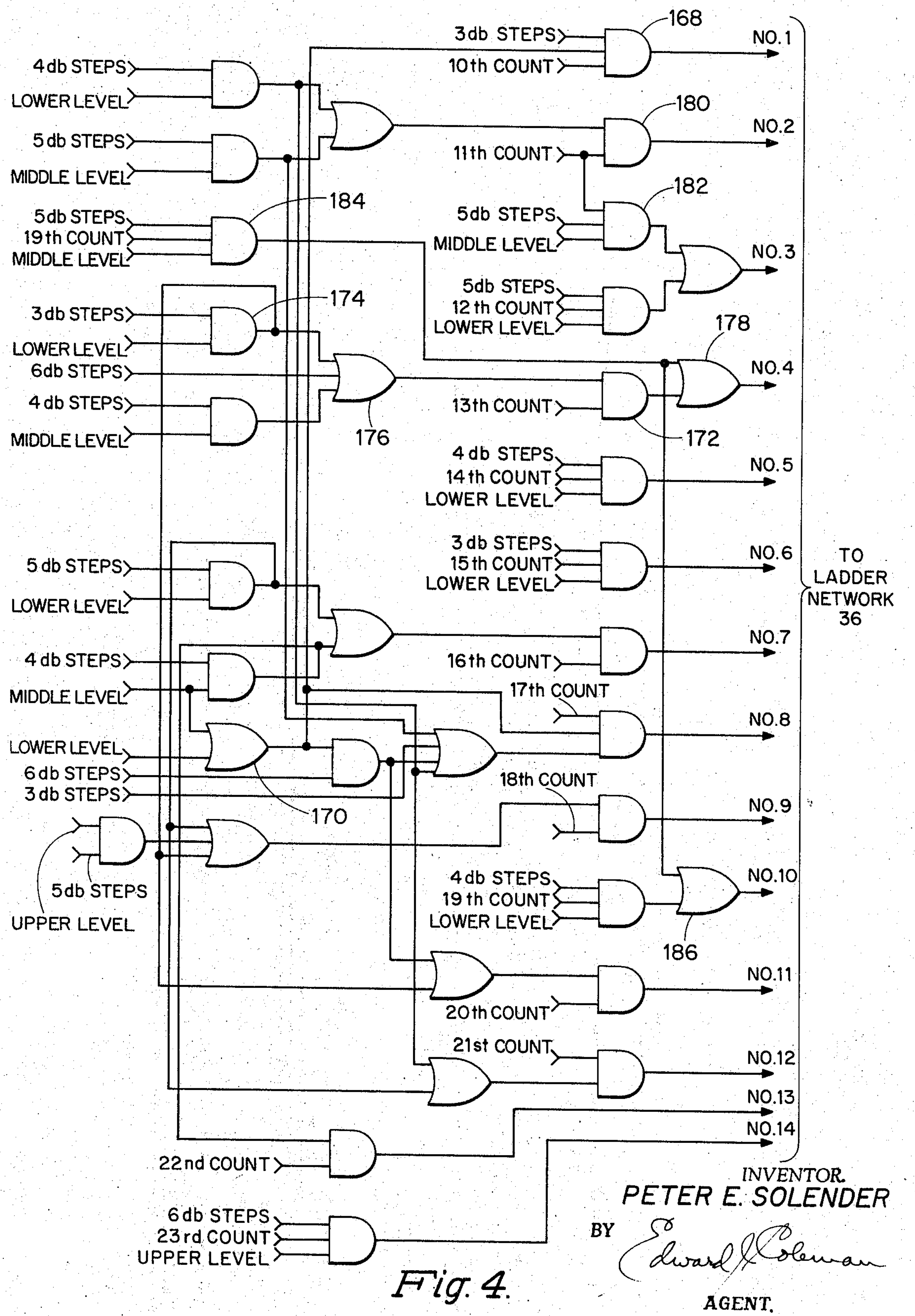
FIG. 4 is a logic diagram of a ladder program decoder useful in the converter of FIG. 1.

For example, decoder 72 may comprise a logic arrangement such as that shown in FIG. 4, in which the basic AND gate matrix is significantly reduced in size by the use of combining logic including OR gates. The inputs denoted as 3db, 4db, 5db and 6db steps are obtained from terminals T1, TG, T3 and T4, respectively, of switch 78. The "lower level", "middle level" and "upper level" signals are obtained from the level choosing decision circuit 50. The 10th count through 23rd count drive pulses are obtained from the binary to decimal converter 74.

The following examples illustrate the arrangement and operation of the decoder 72 logic gates, with reference to Table 1 and FIG. 4. As a logic diagram of the type shown in FIG. 4 is well understood by persons skilled in the art, reference numerals are employed only to facilitate the following illustrations. Assume that the lower level sub-range is selected by decision circuit 50, and that switch 78 is positioned to connect the ground potential enabling level to the 3 db terminal T1. In this event, the pulse No. 1 input to ladder network 36 will be provided by an AND 168 having first and second enable inputs respectively connected to switch terminal T1 and the lower level output line of decision circuit 50 (via or gate 170). The third input of the AND gate 168 would be coupled to the output line converter 74 which produces a pulse in response to a binary input representing the tenth count. Pulse No. 1 activates the ladder network to produce the 3 db output voltage level. From Table 1, it will be noted that the next ladder pulse required is No. 4. Consequently, the decoder requires no AND gates to be enabled by the lower level decision and 3 db step size for the eleventh and twelfth count outputs of the converter 74. Accordingly, the output of ladder network 36 will return to the 0 db reference level during these two counts. The thirteenth count output of converter 74, however, will be applied to an AND gate 172 having the lower level and 3 db step enabling inputs (via gates 174 and 176) and an output connected to the pulse No. 4 input of the ladder network (via OR gate 178). Thus, pulse No. 4 will be applied to the ladder network to activate the 6 db level. The fourteenth count produces no decoder output, but the fifteenth count is gated through decoder 72 as ladder pulse No. 6. If the conversion process is not yet terminated, the seventeenth, eighteenth and twentieth counts will respectively produce ladder pulses No. 8, No. 9 and No. 11. In this manner, ladder network 36 is caused to generate successive reference voltage levels in 3 db amplitude steps, with a return to 0 db occurring between each of the steps, except those produced by ladder pulses No. 8 and No. 9. The return to 0 db between voltage steps is merely a peculiarity of the illustrated implementation and clearly does not detract from the desired step comparison function. With respect to definition of terms used herein, therefore, a "reference voltage amplitude step" refers to the change in ladder network output level produced by a ladder pulse with respect to the 0 db level for the first step and, for subsequent steps, with respect to the voltage level activated by the previous ladder pulse used. Further, the "generation of successive reference voltage levels in equal logarithmic amplitude steps" is deemed to encompass the generation of either adjacent stepped levels or discrete levels having a return to zero between some or all steps.

If decision circuit 50 provides a middle level indication for the 3 db step size, the first nine counts of binary counter 76 will cause 6 fillin pulses to be generated from decoder 92, and the tenth count will cause the binary to decimal converter 74 to apply a pulse to AND gate 168 having enabling inputs connected to switch terminal T1 and the middle level output of the decision circuit (via OR gate 170) with the output of the AND gate 168 being connected to the pulse No. 1 input of the ladder network.

The ladder pulse program of Tables 1 & 4 raise two exceptions to the above-described decoder logic arrangement. Simultaneous application of ladder pulses No. 2 and No. 3, are provided by AND gates 180 and 182 enabled by the middle level decision signal and 5 db step setting and having a third input connected to either the eleventh or twelfth count output line of converter 74. The output of these AND gates are respectively connected to the No. 2 and No. 3 pulse inputs of the ladder network. Ladder pulses No. 10 and No. 4 are applied simultaneously by an AND gate 184 enabled by the middle level signal and 5 db step setting and having a third input connected to the nineteeth count output line of converter 74, the output of the AND gate 184 being connected to both the No. 4 and No. 10 pulse inputs of the ladder network via OR gates 178 and 186, respectively.

During the period of each ladder pulse, the state of the reference comparator 34 is checked by storage flip-flop 104. If this state indicates an exceedence of the gated analog level by the reference level, flip-flop 104 is triggered to generate a stop signal which concludes the analog to digital operation. If eight pulses, including the fill-in pulses, are produced with no such exceedence indicated by comparator 34, a dummy ninth pulse is produced which automatically shuts off the analog to digital converter. This dummy pulse is produced in response to the twenty-fourth count at an output of the binary to decimal converter 74 which is connected via OR gate 105 and line 86 as the stop signal input to flip-flops 82 and 96, and as an input to OR gate 102 for providing the last converter output pulse. It will be noted that the dummy pulse produces no reference level and is denoted as ladder pulse No. 15 in Tables 1 and 4. As a result of the above operation, the fill-in pulses from decoder 92, the ladder pulses generated by decoder 72 and the dummy pulse, if any, together produce the composite analog to digital output pulses. As previously described, generation of the dummy ladder pulse No. 15 or a stop signal from storage flip-flop 104 signals termination of the sample period, and if not externally timed, triggers application of the dump signal at terminal 110.

The above described operation may be illustrated by the following examples, referring to Tables 1 and 4 and FIG. 1.

Example A

Assume that mechanically linked rotary switches 44, 48 and 78 are set to the 51 db dynamic range (5 db steps), i.e. switch terminals V3, V7 and T3, and that the analog input applied at terminal 10 is 13 db above the reference. Decision circuit 50 will then indicate the lower level, and decoder 92 will produce no fill-in pulses. The lower level analog gate 26 will be activated, and the gated 13 db input will be applied to the reference comparator 34. The first comparison with the 0 db reference level will indicate that the reference does not exceed the gated analog input. Decoder 72 will then generate pulse No. 3 to produce a 5 db reference level from the ladder network 36 for the second comparison. This results in the generation of one output pulse via OR gates 100 and 102. Decoder 72 will next generate pulse No. 7 to produce a 10 db reference level for the third comparison. This generates a second converter output pulse. Next, the decoder will generate pulse No. 9 to produce a 15 db reference level and the third converter output pulse. Since the reference level now exceeds the gated analog input, this fourth comparison will trigger flip-flop 104 to produce a stop signal. The resulting digital output number is 3, indicating that the analog input is within the range from 10–15 db.

Example B

Assume the rotary switches are set to the 51 db dynamic range (5 db steps) and that the analog input is 33 db above the reference. Decision circuit 50 will indicate the middle level, and four fill-in pulses will be generated from decoder 92. The middle level analog gate 24 will be activated to permit a 15 db above the reference voltage analog input level to be applied to the reference comparator, recalling that 18 db at the lower level detector is 0 db at the middle level detector. The first comparison, with the 0 db reference level, will result in no exceedence output. Decoder 72 will then simultaneously feed pulses No. 2 and No. 3 to the ladder network to produce a 7 db reference level for the second comparison. This results in generation of the fifth output pulse. The decoder 72 will next generate pulse No. 8 to produce a 12 db reference level for the third comparison. This generates the sixth output pulse. Next, decoder 72 will simultaneously feed pulses No. 4 and No. 10 to the ladder network to produce a 17 db reference level and the seventh output pulse. Since the reference level now exceeds the gated analog input, this fourth comparison will produce a stop signal from flip-flop 104. The resulting digital output number is 7, indicating the analog input is within the range from 30–35 db.

Example C

Assume that the rotary switches are set to the 51 db dynamic range (5 db steps) and the analog input is 52 db above the reference. Decision circuit 50 will indicate the upper level and seven fill-in pulses will be generated. The upper level analog gate 16 will be activated to permit a 16 db above the reference voltage analog input level to be applied to the reference comparator. The 16 db gated analog level results by recalling that 18 db at the lower level detector is 0 at the middle level detector, and 18 db at the middle level detector is 0 db at the upper level detector, so that $52 - 36 = 16$ db. The first comparison, with the 0 db reference level, will result in no stop signal. Hence, decoder 72 will generate pulse No. 9 to produce a 15 db reference level from the ladder network for the second comparison. This results in generation of the eighth output pulse. Since eight pulses have been generated without an exceedence signal from the reference generator, the binary counter driven converter 74 will next generate the dummy pulse No. 15 to stop the analog to digital operation. The resulting digital output number is 9, indicating that the analog input is above 51 db.

It is apparent that the described analog to digital conversion technique provides numerous advantages. Most importantly, dynamic range and step-size may be readily changed by simple external control. The circuitry is largely digital and thus is easily constructed and relatively inexpensive. The method can be easily expanded so as to measure the analog outputs of a plurality of radio receivers without greatly increasing the size of the analog to digital converter. Specifically, reference comparator 34, the reference level generating circuitry, decision circuit 50, and the fill-in pulse generating circuitry may be employed in common for more than one receiver if the converter time shares the receiver outputs. The analog to digital converter can be used in any type of variable wide dynamic range logarithmic measuring system, and it can be readily adapted to a non-linear step conversion system.

While a particular embodiment of the invention has been illustrated, it is to be understood that the applicant does not wish to be limited thereto since modifications will now be suggested to ones skilled in the art. For example, attenuators may be used in lieu of amplifiers 18 and 28; other types of averaging circuits may be employed in lieu of integrators 14, 22 and 32; switches 44, 48 and 78 may be mechanically independent or combined in a single rotary switch structure; further, the switches may employ any desired plurality of control terminals; and the converter may include just two detector sub-range channels or any reasonable larger plurality of detector channels.

What is claimed is:

1. An analog to digital converter for quantizing an analog signal into a representative number of output pulses comprising, in combination, an analog signal input terminal, a first signal level comparator having first and second inputs, means coupling said analog signal input terminal to the first input of said first comparator, means for generating successive reference voltage levels in equal logarithmic amplitude steps and applying said reference voltage levels to the second input of said first comparator, means for deriving from said reference generating means converter output pulses corresponding in number to the reference voltage steps generated, means for digitally selectively changing the size of said reference voltage amplitude steps, and means coupled to the output of said first comparator for stopping the generation of reference voltage steps in response to an output signal from said first comparator indicating one of said reference voltage levels exceeds the signal level at the first input of said first comparator.

2. An analog to digital converter in accordance with claim 1 wherein said means for coupling the analog signal input terminal to the first input of said first comparator comprises envelope detection means having an input coupled to said analog signal input terminal, and signal averaging means coupled between the output of said detection means and the first input of said first comparator.

3. An analog to digital converter in accordance with claim 1 wherein said means for coupling the analog signal input terminal to the first input of said first comparator comprises: first, second and third signal processing circuits having respective inputs coupled to said analog signal input terminal and adapted to respectively cover first, second and third complementary sub-ranges of a predetermined dynamic range, said second sub-range covering higher input signal levels than said first sub-range, and said third sub-range covering higher input signal levels than said second sub-range; first, second and third analog gates respectively coupled between the outputs of said first, second and third signal processing circuits and the first input of said first comparator; a second comparator having a first input coupled to the output of said first signal processing circuit and a second input coupled to a selected reference voltage source; a third comparator having a first input coupled to the output of said second signal processing circuit and a second input coupled to a selected reference voltage source; a decision circuit responsive to the outputs of said second and third comparators for providing level choosing signals indicative of the highest sub-range within which a converter input signal lies; means coupling the level choosing signals from said decision circuit to control the operation of said analog gates; and means controlled by said level choosing signals for generating a first predetermined number of converter output pulses when said level choosing signal indicates a converter input signal lies within said second sub-range and a second predetermined number of converter output pulses when said level choosing signal indicates a converter input signal lies within said third sub-range.

4. An analog to digital converter in accordance with claim 1 wherein said means for generating successive reference voltage levels comprises a ladder network having a plurality of inputs and an output from which said voltage levels are generated in response to selective application of control pulses to the inputs thereof, said ladder network output being coupled to the second input of said comparator, a decoder having a plurality of outputs respectively coupled to the inputs of said ladder network and a plurality of pulse inputs, and means for sequentially applying pulses to the inputs of said decoder.

5. An analog to digital converter in accordance with claim 4 wherein said decoder has a plurality of control voltage inputs, and said means for selectively changing the size of said reference voltage amplitude steps comprises a switching means for selectively connecting one of the control voltage inputs of said decoder to an enabling voltage level source.

6. An analog to digital converter in accordance with claim 5 wherein said means for deriving converter output pulses comprises means providing an OR gate function coupled to the outputs of said decoder.

7. An analog to digital converter in accordance with claim 1 wherein said means for coupling the analog signal input terminal to the first input of said first comparator comprises at least first and second signal processing circuits having respective inputs coupled to said analog signal input terminal and adapted to respectively cover complementary sub-ranges of a predetermined dynamic range, the dynamic sub-range of said second signal processing circuit covering higher input signal levels than the sub-range of said first signal processing circuit, first and second gates respectively coupled between the outputs of said first and second signal processing circuits and the first input of said first comparator, means for comparing the output of said first signal processing circuit with a selected reference voltage and responsively providing signal level decision information to control said first and second gates, and means controlled by said signal level decision information for generating a predetermined number of converter output pulses when said decision information indicates a converter input signal level within the dynamic sub-range of said second signal processing circuit.

8. An analog to digital converter in accordance with claim 7 wherein: said first signal processing circuit comprises an amplifier, a first envelope detector and a first integrator serially connected in that order between said analog signal input terminal and said first gate; said second signal processing circuit comprises a second envelope detector and a second integrator serially connected in that order between said analog signal input terminal and said second gate; and the outputs of said first and second signal processing circuits comprise the outputs of said first and second integrators, respectively.

9. An analog to digital converter in accordance with claim 7 wherein said reference voltage selected for comparison with the output of said first signal processing circuit is provided by a first switching means selectively connecting said comparison means to one of a plurality of voltage sources, said first switching means being operative to vary the dynamic range of said converter, and said means controlled by signal level decision information for generating a predetermined number of converter output pulses is additionally controlled by said means for selectively changing the size of said reference voltage amplitude steps whereby said generated pulses represent fill-in pulses corresponding in number to the amplitude increments of the selected reference voltage step size which lie within the dynamic sub-range of said first signal processing circuit.

10. An analog to digital converter in accordance with claim 9 wherein: said means for generating successive reference voltage levels comprises a ladder network having a plurality of inputs and an output from which said voltage levels are generated in response to selective application of control pulses to the inputs thereof, said ladder network output being coupled to the second input of said comparator, a decoder having a plurality of outputs respectively coupled to the inputs of said ladder network, a plurality of first control inputs, a plurality of second control inputs and a plurality of drive inputs, and means for sequentially applying pulses to the drive inputs of said decoder; said means for selectively changing the size of said reference voltage amplitude steps comprises means coupling said signal level decision information to the first control inputs of said decoder, and a second switching means for selectively connecting one of the second control inputs of said decoder to an enabling voltage level source; said means for generating a predetermined number of converter output pulses has a first and second plurality of control inputs, said decision level information being coupled to the first control inputs of said pulse generating means, and said second switching means selectively connecting one of the second control inputs of said pulse generating means to said enabling voltage level source.

* * * * *

UNITED STATES PATENT OFFICE

CERTIFICATE OF CORRECTION

Patent No. 3,855,589 Dated December 17, 1974

Inventor(s) PETER E. SOLENDER

It is certified that error appears in the above-identified patent and that said Letters Patent are hereby corrected as shown below:

Column 5, line 54, change "n" to ---m---.

Column 12, line 41, delete ";".

Column 12, line 54, "AND gate 146" should read ---AND gate 140---.

Column 15, line 29, change "TG" to ---T2---.

Signed and sealed this 18th day of February 1975.

(SEAL)
Attest:

RUTH C. MASON
Attesting Officer

C. MARSHALL DANN
Commissioner of Patents and Trademarks